United States Patent
Simell et al.

(10) Patent No.: US 10,500,580 B2
(45) Date of Patent: Dec. 10, 2019

(54) METHOD FOR FORMING CATALYTIC NANOCOATING

(71) Applicant: TEKNOLOGIAN TUTKIMUSKESKUS VTT OY, Espoo (FI)

(72) Inventors: Pekka Simell, VTT (FI); Matti Reinikainen, VTT (FI); Matti Putkonen, VTT (FI); Johanna Kihlman, VTT (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 76 days.

(21) Appl. No.: 15/541,285

(22) PCT Filed: Dec. 8, 2015

(86) PCT No.: PCT/FI2015/050864
§ 371 (c)(1),
(2) Date: Jun. 30, 2017

(87) PCT Pub. No.: WO2016/107967
PCT Pub. Date: Jul. 7, 2016

(65) Prior Publication Data
US 2017/0361311 A1  Dec. 21, 2017

(30) Foreign Application Priority Data

Dec. 31, 2014  (FI) .................................. 20146178

(51) Int. Cl.
*B01J 21/04* (2006.01)
*B01J 23/75* (2006.01)
(Continued)

(52) U.S. Cl.
CPC ............. *B01J 35/023* (2013.01); *B01J 21/04* (2013.01); *B01J 23/75* (2013.01); *B01J 23/8913* (2013.01);
(Continued)

(58) Field of Classification Search
CPC ...... B01L 21/04; B01L 23/75; B01L 23/8913; B01L 35/0013; B01L 35/0023;
(Continued)

(56) References Cited

U.S. PATENT DOCUMENTS 6,197,365 B1  3/2001  Bachinger et al.
7,259,057 B2 *  8/2007  Choi ................. H01L 21/02178
                                                   257/E21.006
(Continued)

FOREIGN PATENT DOCUMENTS

EP         2 628 817 A1      8/2013
WO    WO 2014/062359 A2      4/2014

OTHER PUBLICATIONS

International Search Report (PCT/ISA/210) dated Mar. 3, 2016, by the European Patent Office as the International Searching Authority for International Application No. PCT/FI2015/050864.
(Continued)

*Primary Examiner* — Cam N. Nguyen
(74) *Attorney, Agent, or Firm* — Buchanan, Ingersoll & Rooney PC

(57) ABSTRACT

Provided is a method forming a catalytic nanocoating on a surface of a metal plate, wherein the method comprises pretreating the surface of the metal plate by means of heat treatment at 500-800° C., forming a metaloxide support by washcoating on the surface of the metal plate, and coating the surface of the metal plate by depositing catalytically active metals and/or metaloxides on the metaloxide support by means of an atomic layer deposition (ALD) method in
(Continued)

order to form a thin and conformal catalyst layer on the metal plate. Further, the invention relates to a catalyst and a use.

8 Claims, 1 Drawing Sheet

(51) Int. Cl.
| | |
|---|---|
| *B01J 23/89* | (2006.01) |
| *B01J 35/00* | (2006.01) |
| *B01J 37/02* | (2006.01) |
| *B01J 37/06* | (2006.01) |
| *B01J 37/08* | (2006.01) |
| *C23C 16/02* | (2006.01) |
| *C23C 16/455* | (2006.01) |
| *B01J 35/02* | (2006.01) |

(52) U.S. Cl.
CPC ....... *B01J 35/0013* (2013.01); *B01J 37/0217* (2013.01); *B01J 37/0219* (2013.01); *B01J 37/0225* (2013.01); *B01J 37/0226* (2013.01); *B01J 37/0228* (2013.01); *B01J 37/0238* (2013.01); *B01J 37/06* (2013.01); *B01J 37/088* (2013.01); *C23C 16/0209* (2013.01); *C23C 16/45553* (2013.01)

(58) Field of Classification Search
CPC ............. B01L 37/0217; B01L 37/0219; B01L 37/0225; B01L 37/0226; B01L 37/0228; B01L 37/0238; B01L 37/06; B01L 37/088; C23C 16/0209; C23C 16/45553
See application file for complete search history.

(56) References Cited

U.S. PATENT DOCUMENTS

| | | | | |
|---|---|---|---|---|
| 9,011,667 | B2* | 4/2015 | Abd Elhamid | ........ B82Y 30/00 |
| | | | | 205/105 |
| 9,136,545 | B2* | 9/2015 | Dadheech | ........... H01M 8/0206 |
| 2005/0170234 | A1 | 8/2005 | Liu et al. | |
| 2007/0265159 | A1 | 11/2007 | Elam et al. | |
| 2012/0172211 | A1 | 7/2012 | Lu et al. | |
| 2013/0209767 | A1 | 8/2013 | Kolev et al. | |
| 2015/0290623 | A1 | 10/2015 | Van Norman et al. | |

OTHER PUBLICATIONS

Written Opinion (PCT/ISA/237) dated Mar. 3, 2016, by the European Patent Office as the International Searching Authority for International Application No. PCT/FI2015/050864.

Search Report dated Aug. 31, 2015, issued by the Finnish Patent and Registration Office for the priority Finnish Patent Application No. 20146178.

Marin et al., Corrosion protection of AISI 316 stainless steel by ALD alumina/titania nanometric coatings, *J. Coat. Technol. Res.*, vol. 8 (5), pp. 655-659, Oct. 2011, DOI 10.1007/s11998-011-9327-0.

Lashdaf et al., Deposition of palladium and ruthenium β-diketonates on alumina and silica supports in gas and liquid phase, *Applied Catalysis A: General* 241, Feb. 2003, pp. 51-63, Elsevier Science B.V., PII: S0926-860X(02)00424-6.

* cited by examiner

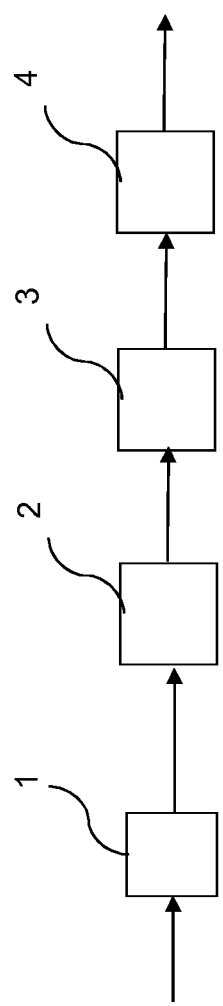

METHOD FOR FORMING CATALYTIC NANOCOATING

FIELD OF THE INVENTION

The invention relates to a method for forming catalytic nanocoating on a surface of a metal plate. Further, the invention relates to a catalyst comprising a catalytic nanocoating on the surface of a metal plate, and a method of forming a nanocoating in a reactor.

BACKGROUND OF THE INVENTION

Different methods for preparing catalysts are known from the prior art. In the art there are several types of catalysts which differ both in structure and materials. One specific type of catalyst consists of a metal substrate on which a catalytically active layer has been deposited.

Several methods for the deposition of the active layer are known from the prior art. Typically, the catalytically active layer is added to the metal substrate by washcoating using alumina or another metal oxide slurry containing the catalytically active metals in the form of salts, oxides or elemental metals. Substrates can also be first washcoated with a metal oxide slurry, and then a catalyst metal addition can be performed using traditional methods, such as impregnation. In these methods it is difficult to control the size of the metal particles, dispersion or the thickness of the layer. Thus, excessively high metal loadings have to be used in order to obtain high catalytic activity. It is beneficial to decrease the metal loading in catalytic reactors, for instance, due to the fact that catalytically active metals are in many cases getting more and more expensive and many of them are rare and strategic metals.

Further, from the prior art is known an atomic layer deposition (ALD) method for coating different materials.

OBJECTIVE OF THE INVENTION

The objective of the invention is to disclose a new type method for forming catalytic nanocoating. Further, the objective of the invention is to disclose a method for forming a new type catalyst.

SUMMARY OF THE INVENTION

The method according to the invention is characterized by what has been presented in the claims.

The invention is based on a method for forming a catalytic nanocoating on a surface of a metal plate. The method comprises: pretreating the surface of the metal plate by means of heat treatment at 500-800° C., forming a metaloxide support, e.g. $Al_2O_3$ support, by washcoating on the surface of the metal plate, and coating the surface of the metal plate by depositing catalytically active metals and/or metaloxides on the metaloxide support by means of an atomic layer deposition (ALD) method in order to form a thin and conformal catalyst layer on the metal plate.

In the invention, a surface of a metal plate is pretreated and a catalytic nanocoating of catalytically active metals and/or metaloxides is formed by using ALD-technique on the metal plate. In the invention, the catalytic nanocoating can be arranged directly onto the metal plate. The structure of the surface of the metal plate can be modified when the metal plate is pretreated at high temperature. Then the catalytic nanocoating with permanent and durable properties can be formed on the metal plate.

Further, the invention is based on a catalyst which comprises a catalytic nanocoating, preferably a catalyst layer, on the surface of the metal plate, and the catalytic nanocoating has been formed onto the surface of the metal plate according to the method presented in this context. The catalytic nanocoating is a catalytically active coating.

Any material formed by atomic layer deposition (ALD) method which is suitable as a catalytic nanocoating, preferably a catalyst layer, and which is known per se can be used in the method of the present invention. The atomic layer deposition (ALD) is a thin film deposition process which applies self-limiting and sequential surface reactions for thin film preparation. ALD uses volatile or gaseous chemicals, such as precursors, to grow conformal thin films. During the first ALD step molecules containing element A are introduced onto a surface of a substrate, and the first molecules are adsorbed on the surface. Then second molecules containing element B introduced for reacting with element A at the surface and then one layer of compound AB is achieved. This procedure is repeated until desired film thickness is achieved. Other reaction mechanisms related to ALD technology can be applied as well.

In this context, a metaloxide support may comprise any metaloxide or any mixture of different metaloxides. Further, the metaloxide support may comprise other components, e.g. suitable binder and/or filler agent. In one embodiment, the metaloxide support is formed from metaloxide or metaloxides selected from the group consisting of $Al_2O_3$, MgO, $TiO_2$, other suitable metaloxide and their combinations. In one embodiment, the metaloxide support is $Al_2O_3$ support which comprises $Al_2O_3$.

In this context, catalytically active metal and/or metaloxide may comprise any suitable metal which is catalytically active metal. In one embodiment, metal is selected from the group consisting of Co, Ni, Mo, Zr, Ti, Hf, noble metal, other suitable metal and their combinations.

In this context, a metal plate may be any metal plate, metal film, metal disc, metal board, metal sheet, metal foam, metal filter tube or the like. The metal plate can be either a smooth plate or in corrugated or otherwise non-planar structure, such as a heat-exchanger plate.

In one embodiment, the surface of the metal plate is heat-treated by oxidizing, preferably at temperatures between 500-800° C.

In one embodiment, the surface of the metal plate is washcoated with a metaloxide based slurry, e.g. $Al_2O_3$ based slurry.

In one embodiment, the washcoating is carried out by spraying. In one embodiment, the washcoating is carried out by dip-coating. Alternatively, the washcoating can be carried out by other suitable method.

In one embodiment, the metaloxide support formed by washcoating is calcined at 500-800° C., preferably the metaloxide support is calcined at 500-800° C. after the washcoating.

In one embodiment, deposition temperature is adjusted during the deposition of catalytically active metals and/or metaloxides on the metaloxide support.

In one embodiment, catalytically active metals and/or metaloxides are deposited at 50-700° C. on the metaloxide support by means of an atomic layer deposition (ALD) method. In one embodiment, catalytically actine metals and/or metaloxides are deposited at about 100-300° C. on the metaloxide support. In one embodiment, catalytically active Co oxide is deposited at 140-160° C., preferably at about 150° C., on the metaloxide support.

In one embodiment, a surface coverage on the metal plate can be adjusted by either changing a deposition temperature or increasing a deposition time.

In one embodiment, the thickness of the catalyst layer is between 1-500 nm.

In one embodiment, tris(2,2,6,6-tetramethyl-3,5-heptanedionato)cobalt and ozone are used as precursors in the atomic layer deposition (ALD). Alternatively, any other suitable precursors can be used in the atomic layer deposition (ALD).

The catalyst may be formed with different structures, in one embodiment with a monolith element. In one embodiment, the catalyst is used in catalytic reactors, in self-cleaning surfaces, in production of biomass derived chemicals, in production of transportation fuels, in FT-synthesis, in reformers for fuel cell applications, in gas treatment units for syngas applications or in aqueous phase reformers for biorefineries.

In one embodiment, the method is used to form a catalytic nanocoating into reactors, such as catalytic reactors, reformers of fuel cell applications and aqueous phase reformers for biorefinery, and in processes, such as production of biomass derived chemicats, production of transportation fuels, FT-synthesis and gas treatment unit for syngas applications and production of self-cleaning surfaces, and their combinations.

A combination comprising a pretreatment of the metal surface and a coating of the metal surface with catalytically active metals and/or metaloxides by using ALD-method is important for the invention. Thanks to the invention a catalytic nanocoating which is durable and has a high surface area and low catalyst loading can be produced on the metal plate. Thanks to the invention the catalytic nanocoating can be formed directly on the metal plate. The surface-controlled method of the invention enables strict control of the metal or metaloxide deposition. This nanocoating can be easily applied for different nanocoatings.

The invention provides the advantage that catalysts with good quality can be achieved and metal loading in catalysts can be decreased. Thanks to the invention active catalysts can be prepared with the least amount of metals. This enables lower investment and operation costs in many industry processes based on the use of catalysts. Thanks to the invention reactor throughput can be improved.

Further, the combination of the invention opens up possibilities to improve technical and economic feasibility in production processes of various bio-mass derived chemicals and transportation fuels.

The present invention provides an industrially applicable, simple and affordable way of producing catalytic nanocoatings. The method of the present invention is easy and simple to realize as a production process.

LIST OF FIGURES

In the following section, the invention will be described with the aid of detailed exemplary embodiments, referring to the accompanying drawing wherein FIG. 1 presents a flowchart illustration of a method according to one embodiment of the present invention.

DETAILED DESCRIPTION OF THE INVENTION

FIG. 1 presents the method according to the invention for forming a catalytic nanocoating.

Example 1

In the method of FIG. 1 a catalytic nanocoating is formed on a surface of a metal plate.

The surface of the metal plate is pretreated (1) by means of heat treatment by oxidizing at 500-800° C. The metaloxide support, such as $Al_2O_3$ support, is formed by washcoating (2) on the pretreated metal surface so that the metal surface is washcoated with metaloxide based slurry, such as $Al_2O_3$ based slurry, by spraying or dip-coating. The washcoated support is calcined (3) at 500-800° C. on the metal surface. The catalytically active metals and/or metaloxides, such as Co oxide, are deposited (4) by means of an atomic layer deposition (ALD) method on the metal surface which has been coated with the metaloxide support. The catalytically active metals and/or metaloxides are deposited at temperature between 140 to 300° C. on the metaloxide support. Tris(2,2,6,6-tetramethyl-3,5-heptanedionato)cobalt and ozone are used as precursors in the ALD process. Nitrogen is used as a carrier and purging gas. Depending on the number of cycles a catalyst layer which has a thickness between 1-500 nm is formed on the metaloxide support.

The metals and/or metaloxides can be homogeneously dispersed on the metaloxide support, and at high temperature they are also well adhered on the surface.

The devices used in example 1 and this invention are known per se, and therefore they are not described in any more detail in this context.

Example 2

In this test process conditions were studied.

Picosun Sunale R-200 ALD reactor was used for deposition of $CoO_x$ in single wafer mode. Co(thd)3 i.e. tris(2,2,6,6-tetramethyl-3,5-heptanedionato)cobalt (abcr GmbH & Co. KG, purity 99%) and ozone (O3) (O2 99.999% purity, AC-SERIES ozone generator, IN USA, Inc.) were used as precursors. Nitrogen (99.999%) was used as a carrier and purging gas.

Different deposition temperatures, precursor temperatures, pulse and purge times and line flows were tested in order to find the best parameters for the film growth. After optimizing deposition parameters $CoO_x$ depositions were performed at about 150° C. Film thicknesses on Si reference substrates were measured by ellipsometer (SE400adv, SENTECH Instruments). Deposition rate was around 0.2 Å/cycle at 150° C. After ALD deposition catalytic activity was evaluated by existing methods. It was observed that catalytic activity was achieved.

The method according to the invention is suitable in different embodiments for forming different catalytic nanocoatings. The method according to the invention is suitable in different embodiments for forming different kinds of catalysts.

The invention is not limited merely to the examples referred to above; instead many variations are possible within the scope of the inventive idea defined by the claims.

The invention claimed is:

1. A method for forming a catalytic nanocoating on a surface of a metal plate, wherein the method comprises
   pretreating the surface of the metal plate by means of heat treatment at 500-800° C.,
   forming a metal oxide support by washcoating on the surface of the metal plate such that the surface of the metal plate is washcoated with a metal oxide based slurry,
   calcining the metal oxide support at 500-800° C. after the washcoating, and
   coating the surface of the metal plate by depositing catalytically active metals and/or metal oxides on the metal oxide support by means of an atomic layer deposition (ALD) method in order to form a thin and conformal catalyst layer on the metal plate.

2. The method according to claim 1, wherein the surface of the metal plate is heat-treated by oxidizing.

3. The method according to claim 1, wherein the wash-coating is carried out by spraying or dip-coating.

4. The method according to claim 1, wherein catalytically active metals and/or metal oxides are deposited at 50-700° C. on the metal oxide support by means of an atomic layer deposition (ALD) method.

5. The method according to claim 1, wherein the thickness of the catalyst layer is between 1-500 nm.

6. The method according to claim 1, wherein tris(2,2,6,6-tetramethyl-3,5-heptanedionato)cobalt and ozone are used as precursors in the atomic layer deposition (ALD).

7. The method according to claim 1, wherein the metal oxide support comprises $Al_2O_3$, MgO, $TiO_2$, other metal oxide or their combination.

8. The method according to claim 1, wherein catalytically active metal and/or metal oxide comprises metal selected from the group consisting of Co, Ni, Mo, Zr, Ti, Hf, noble metal, other suitable metal and their combinations.

* * * * *